United States Patent
Patrick et al.

(10) Patent No.: US 8,796,153 B2
(45) Date of Patent: *Aug. 5, 2014

(54) CLAMPED MONOLITHIC SHOWERHEAD ELECTRODE

(71) Applicant: Lam Research Corporation, Fremont, CA (US)

(72) Inventors: Roger Patrick, Mountain View, CA (US); Gregory R. Bettencourt, Fremont, CA (US); Michael C. Kellogg, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/793,278

(22) Filed: Mar. 11, 2013

(65) Prior Publication Data

US 2013/0337654 A1    Dec. 19, 2013

Related U.S. Application Data

(62) Division of application No. 13/526,974, filed on Jun. 19, 2012, now Pat. No. 8,414,719, which is a division of application No. 12/216,524, filed on Jul. 7, 2008, now Pat. No. 8,221,582.

(51) Int. Cl.
*H01L 21/3065* (2006.01)

(52) U.S. Cl.
USPC .................................. 438/715; 156/345.34

(58) Field of Classification Search
None
See application file for complete search history.

(56) References Cited

U.S. PATENT DOCUMENTS

| | | | |
|---|---|---|---|
| 4,585,920 | A | 4/1986 | Hoog et al. |
| 4,612,077 | A | 9/1986 | Tracy et al. |
| 4,908,095 | A | 3/1990 | Kagatsume et al. |
| 5,074,456 | A | 12/1991 | Degner et al. |
| 5,200,016 | A | 4/1993 | Namose |
| 5,356,515 | A | 10/1994 | Tahara et al. |
| 5,423,936 | A | 6/1995 | Tomita et al. |
| D363,464 | S | 10/1995 | Fukasawa |
| 5,500,256 | A | 3/1996 | Watabe et al. |
| 5,534,751 | A | 7/1996 | Lenz et al. |

(Continued)

FOREIGN PATENT DOCUMENTS

| | | |
|---|---|---|
| JP | 56-087667 A1 | 7/1981 |
| JP | 07-066180 A | 3/1995 |

(Continued)

OTHER PUBLICATIONS

International Search Report and Written Opinion mailed Feb. 24, 2010 for PCT/US2009/003952.

(Continued)

*Primary Examiner* — Allan Olsen
(74) *Attorney, Agent, or Firm* — Buchanan Ingersoll & Rooney PC

(57) ABSTRACT

An electrode assembly for a plasma reaction chamber used in semiconductor substrate processing. The assembly includes an upper showerhead electrode which is mechanically attached to a backing plate by a series of spaced apart cam locks. A guard ring surrounds the backing plate and is movable to positions at which openings in the guard ring align with openings in the backing plate so that the cam locks can be rotated with a tool to release locking pins extending from the upper face of the electrode.

9 Claims, 9 Drawing Sheets

(56) References Cited

U.S. PATENT DOCUMENTS

| | | |
|---|---|---|
| 5,569,356 A | 10/1996 | Lenz et al. |
| 5,589,002 A | 12/1996 | Su |
| 5,590,975 A | 1/1997 | Horntvedt |
| 5,593,540 A | 1/1997 | Tomita et al. |
| 5,624,498 A | 4/1997 | Lee et al. |
| 5,740,009 A | 4/1998 | Pu et al. |
| 5,746,875 A | 5/1998 | Maydan et al. |
| 5,766,364 A | 6/1998 | Ishida et al. |
| 5,792,269 A | 8/1998 | Deacon et al. |
| D411,516 S | 6/1999 | Imafuku et al. |
| D412,513 S | 8/1999 | Ooyabu |
| 5,959,409 A | 9/1999 | Dornfest et al. |
| 5,993,597 A | 11/1999 | Saito et al. |
| 5,997,649 A | 12/1999 | Hillman |
| D420,022 S | 2/2000 | Burkhart et al. |
| 6,024,799 A | 2/2000 | Chen et al. |
| 6,036,782 A | 3/2000 | Tanaka et al. |
| 6,039,836 A | 3/2000 | Dhindsa et al. |
| 6,050,216 A | 4/2000 | Szapucki et al. |
| 6,050,506 A | 4/2000 | Guo et al. |
| D425,919 S | 5/2000 | Burkhart et al. |
| 6,079,356 A | 6/2000 | Umotoy et al. |
| 6,086,710 A | 7/2000 | Miyashita et al. |
| 6,110,287 A | 8/2000 | Arai et al. |
| 6,110,556 A | 8/2000 | Bang et al. |
| 6,132,512 A | 10/2000 | Horie et al. |
| 6,170,432 B1 | 1/2001 | Szapucki et al. |
| 6,173,673 B1 | 1/2001 | Golovato et al. |
| 6,200,415 B1 | 3/2001 | Maraschin |
| 6,206,972 B1 | 3/2001 | Dunham |
| D441,348 S | 5/2001 | Todd et al. |
| 6,228,208 B1 | 5/2001 | Lill et al. |
| 6,237,528 B1 | 5/2001 | Szapucki et al. |
| 6,302,964 B1 | 10/2001 | Umotoy et al. |
| 6,368,450 B2 | 4/2002 | Hayashi |
| 6,389,677 B1 | 5/2002 | Lenz |
| 6,391,787 B1 | 5/2002 | Dhindsa et al. |
| 6,432,261 B2 | 8/2002 | Watanabe et al. |
| 6,444,037 B1 | 9/2002 | Frankel et al. |
| 6,461,435 B1 | 10/2002 | Littau et al. |
| 6,468,925 B2 | 10/2002 | Campbell et al. |
| 6,477,980 B1 | 11/2002 | White et al. |
| 6,495,233 B1 | 12/2002 | Shmurun et al. |
| 6,506,685 B2 | 1/2003 | Li et al. |
| 6,506,686 B2 | 1/2003 | Masuda et al. |
| 6,550,126 B1 | 4/2003 | Szettella et al. |
| 6,553,932 B2 | 4/2003 | Liu et al. |
| 6,558,506 B1 | 5/2003 | Freeman et al. |
| 6,586,886 B1 | 7/2003 | Katz et al. |
| 6,653,734 B2 | 11/2003 | Flanner et al. |
| 6,702,503 B2 | 3/2004 | Pinzl |
| 6,723,202 B2 | 4/2004 | Nagaiwa et al. |
| D490,450 S | 5/2004 | Hayashi et al. |
| 6,753,498 B2 | 6/2004 | Sirkis et al. |
| D493,873 S | 8/2004 | Hayashi |
| 6,786,175 B2 | 9/2004 | Dhindsa et al. |
| 6,818,096 B2 | 11/2004 | Barnes et al. |
| 6,823,589 B2 | 11/2004 | White et al. |
| 6,827,815 B2 | 12/2004 | Hytros et al. |
| 6,838,012 B2 | 1/2005 | Lenz |
| 6,863,784 B2 | 3/2005 | Hao et al. |
| 6,872,258 B2 | 3/2005 | Park et al. |
| 6,899,786 B2 | 5/2005 | Senzaki et al. |
| 6,936,135 B2 | 8/2005 | Antolik |
| 6,942,753 B2 | 9/2005 | Choi et al. |
| 7,083,702 B2 | 8/2006 | Blonigan et al. |
| 7,159,537 B2 | 1/2007 | Wickramanayaka et al. |
| 7,166,200 B2 | 1/2007 | Saigusa et al. |
| 7,189,432 B2 | 3/2007 | Chiang et al. |
| 7,196,283 B2 | 3/2007 | Buchberger, Jr. et al. |
| 7,211,170 B2 | 5/2007 | Antolik |
| 7,244,311 B2 | 7/2007 | Fischer |
| 7,270,713 B2 | 9/2007 | Blonigan et al. |
| 7,296,534 B2 | 11/2007 | Fink |
| 7,430,986 B2 | 10/2008 | Dhindsa et al. |
| 7,431,788 B2 | 10/2008 | Ricci et al. |
| 7,438,018 B2 | 10/2008 | Son |
| 7,481,903 B2 | 1/2009 | Senzaki et al. |
| 7,585,386 B2 | 9/2009 | Okumura et al. |
| 7,645,341 B2 | 1/2010 | Kennedy et al. |
| 7,713,379 B2 | 5/2010 | Rogers |
| 7,728,251 B2 | 6/2010 | Ide et al. |
| 7,732,012 B2 | 6/2010 | Hongu et al. |
| 7,740,736 B2 | 6/2010 | Fischer et al. |
| 7,740,737 B2 | 6/2010 | Koshiishi et al. |
| 7,820,007 B2 | 10/2010 | Fujiwara et al. |
| 7,829,468 B2 | 11/2010 | Keil et al. |
| 7,854,820 B2 | 12/2010 | de la Llera et al. |
| 7,861,667 B2 | 1/2011 | Fischer et al. |
| 7,862,682 B2 | 1/2011 | Stevenson et al. |
| 7,875,824 B2 | 1/2011 | Larson et al. |
| 7,988,816 B2 | 8/2011 | Koshiishi et al. |
| 8,008,596 B2 | 8/2011 | Koshiishi et al. |
| 8,152,954 B2 | 4/2012 | Bettencourt et al. |
| 8,161,906 B2 | 4/2012 | Kadkhodayan et al. |
| 8,187,413 B2 | 5/2012 | Patrick et al. |
| 8,187,414 B2 | 5/2012 | Hardin et al. |
| 8,206,506 B2 | 6/2012 | Kadkhodayan et al. |
| 8,216,418 B2 | 7/2012 | Patrick et al. |
| 8,221,582 B2 | 7/2012 | Patrick et al. |
| 8,272,346 B2 | 9/2012 | Bettencourt et al. |
| 8,313,610 B2 | 11/2012 | Dhindsa |
| 8,313,805 B2 * | 11/2012 | Kadkhodayan et al. ... 427/248.1 |
| 8,398,778 B2 | 3/2013 | Fang et al. |
| 8,402,918 B2 | 3/2013 | Kadkhodayan et al. |
| 8,414,719 B2 | 4/2013 | Patrick et al. |
| 8,418,649 B2 | 4/2013 | Larson et al. |
| 8,419,959 B2 | 4/2013 | Bettencourt et al. |
| 8,536,071 B2 * | 9/2013 | Bettencourt et al. ......... 438/798 |
| 2002/0179245 A1 | 12/2002 | Masuda et al. |
| 2003/0127806 A1 | 7/2003 | Belchuk |
| 2003/0185729 A1 | 10/2003 | Ko et al. |
| 2004/0173313 A1 | 9/2004 | Beach et al. |
| 2006/0000803 A1 | 1/2006 | Koshiishi et al. |
| 2006/0011298 A1 | 1/2006 | Lim et al. |
| 2006/0016559 A1 | 1/2006 | Kobayashi et al. |
| 2006/0042754 A1 | 3/2006 | Yoshida et al. |
| 2006/0054280 A1 | 3/2006 | Jang |
| 2006/0108069 A1 | 5/2006 | Gernert |
| 2006/0236934 A1 | 10/2006 | Choi et al. |
| 2007/0044716 A1 | 3/2007 | Tetsuka et al. |
| 2007/0068629 A1 | 3/2007 | Shih et al. |
| 2007/0187038 A1 | 8/2007 | Ren et al. |
| 2007/0235660 A1 | 10/2007 | Hudson |
| 2008/0087641 A1 | 4/2008 | de la Llera et al. |
| 2008/0141941 A1 | 6/2008 | Augustino et al. |
| 2009/0095220 A1 | 4/2009 | Meinhold et al. |
| 2009/0223932 A1 | 9/2009 | Hida et al. |
| 2011/0042879 A1 | 2/2011 | Kellogg et al. |
| 2011/0083809 A1 | 4/2011 | de la Llera et al. |
| 2011/0100552 A1 | 5/2011 | Dhindsa et al. |
| 2011/0100553 A1 | 5/2011 | Dhindsa et al. |
| 2011/0108524 A1 | 5/2011 | Dhindsa et al. |
| 2012/0055632 A1 | 3/2012 | de la Llera et al. |
| 2012/0285477 A1 | 11/2012 | Sherwood et al. |

FOREIGN PATENT DOCUMENTS

| | | |
|---|---|---|
| JP | 09-013172 A | 1/1997 |
| JP | 09-245994 A | 9/1997 |
| JP | 2001-085398 A | 3/2001 |
| JP | 2002-198353 A | 7/2002 |

OTHER PUBLICATIONS

Official Action dispatched Mar. 6, 2012 for Japanese Patent Appln. No. 2011-510519.

* cited by examiner

US 8,796,153 B2

CLAMPED MONOLITHIC SHOWERHEAD ELECTRODE

FIELD OF THE INVENTION

The invention relates to a showerhead electrode assembly of a plasma processing chamber in which semiconductor components can be manufactured.

SUMMARY

According to one embodiment, a showerhead electrode assembly comprises a monolithic stepped electrode clamped to a backing plate wherein the showerhead electrode assembly comprises an upper electrode of a capacitively coupled plasma processing chamber. The stepped electrode is a circular plate having a plasma exposed surface on a lower face thereof and a mounting surface on an upper face thereof. The mounting surface includes a plurality of alignment pin recesses configured to receive alignment pins arranged in a pattern matching alignment pin holes in a backing plate against which the plate is held by cam locks and the plate includes process gas outlets arranged in a pattern matching gas supply holes in the backing plate. The upper face includes an outer recessed surface surrounding a planar inner surface, the plasma exposed surface including inner and outer inclined surfaces. A plurality of circumferentially spaced apart pockets in the outer recessed surface are configured to receive locking pins therein adapted to cooperate with cam locks to clamp the stepped electrode to the backing plate.

According to another embodiment, a showerhead electrode assembly of a capacitively coupled plasma processing chamber comprises a thermal control plate, a backing plate, a guard ring and a stepped electrode. The thermal control plate is supported by a temperature controlled wall of the plasma processing chamber, the thermal control plate having a diameter larger than a wafer to be processed in the plasma processing chamber and including annular projections on a lower side thereof with gas plenums between the annular projections. The backing plate is supported by the thermal control plate and has a diameter smaller than the thermal control plate, gas passages therethrough, and cam locks in horizontally extending bores. The shield ring has a height equal to a thickness of the outer periphery of the backing plate and at least one horizontally extending access bore passing through the shield ring, the shield ring being rotatable around the backing plate to align the access bore with at least one of the cam locks. The stepped electrode has gas passages therethrough in fluid communication with the gas passages in the backing plate The stepped electrode includes vertically extending locking pins which engage the cam locks, the stepped electrode supporting the shield ring and being removable by releasing the locking pins from the cam locks.

DETAILED DESCRIPTION

Figure 1:
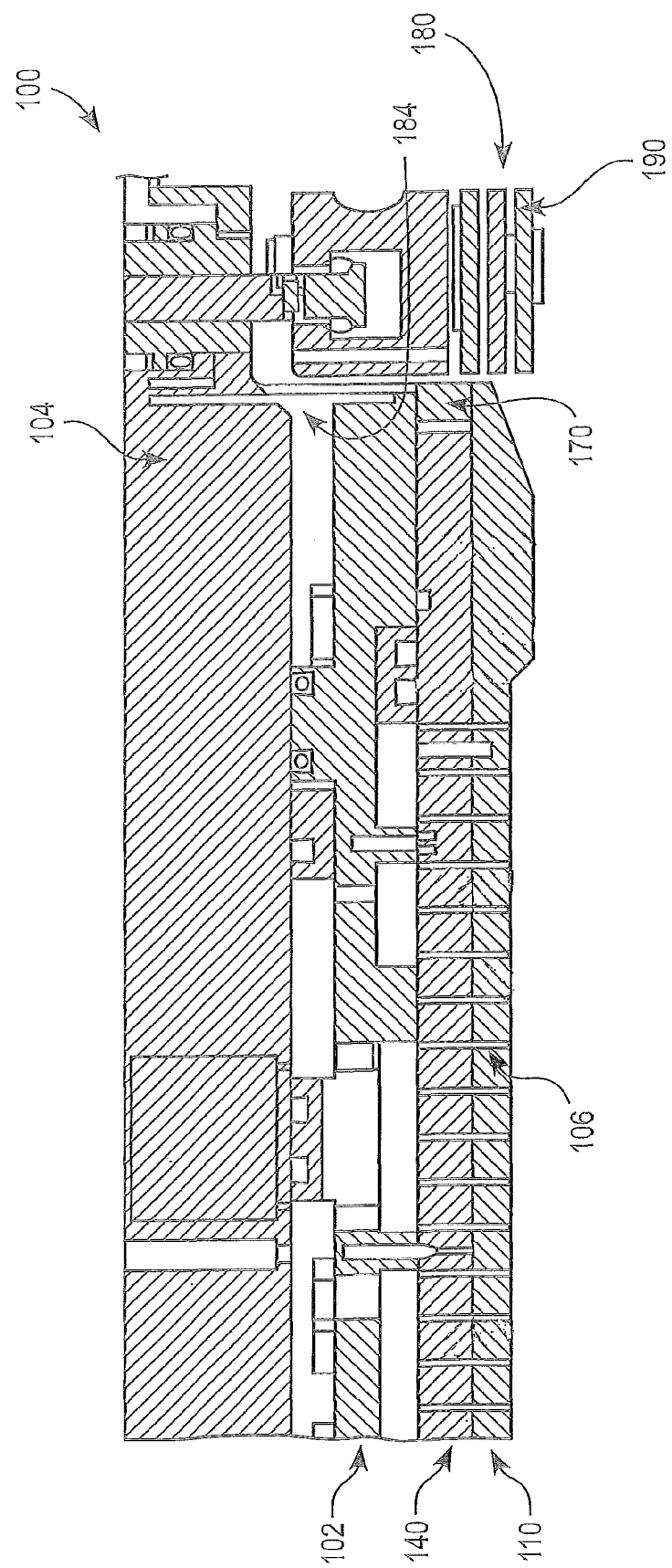
FIG. 1 shows a cross-sectional view of a showerhead electrode assembly forming an upper electrode of a capacitively coupled plasma reactor for etching substrates having a guard ring.

The fabrication of an integrated circuit chip typically begins with a thin, polished slice of high-purity, single-crystal semiconductor material substrate (such as silicon or germanium) called a "wafer." Each wafer is subjected to a sequence of physical and chemical processing steps that form the various circuit structures on the wafer. During the fabrication process, various types of thin films may be deposited on the wafer using various techniques such as thermal oxidation to produce silicon dioxide films, chemical vapor deposition to produce silicon, silicon dioxide, and silicon nitride films, and sputtering or other techniques to produce other metal films.

After depositing a film on the semiconductor wafer, the unique electrical properties of semiconductors are produced by substituting selected impurities into the semiconductor crystal lattice using a process called doping. The doped silicon wafer may then be uniformly coated with a thin layer of photosensitive, or radiation sensitive material, called a "resist." Small geometric patterns defining the electron paths in the circuit may then be transferred onto the resist using a process known as lithography. During the lithographic process, the integrated circuit pattern may be drawn on a glass plate called a "mask" and then optically reduced, projected, and transferred onto the photosensitive coating.

The lithographed resist pattern is then transferred onto the underlying crystalline surface of the semiconductor material through a process known as etching. Vacuum processing chambers are generally used for etching and chemical vapor deposition (CVD) of materials on substrates by supplying an etching or deposition gas to the vacuum chamber and application of a radio frequency (RF) field to the gas to energize the gas into a plasma state.

A reactive ion etching system typically consists of an etching chamber with an upper electrode or anode and a lower electrode or cathode positioned therein. The cathode is negatively biased with respect to the anode and the container walls. The wafer to be etched is covered by a suitable mask and placed directly on the cathode. A chemically reactive gas such as $CF_4$, $CHF_3$, $CClF_3$, $HBr$, $Cl_2$ and $SF_6$ or mixtures thereof with $O_2$, $N_2$, $He$ or $Ar$ is introduced into the etching chamber and maintained at a pressure which is typically in the millitorr range. The upper electrode is provided with gas hole(s), which permit the gas to be uniformly dispersed through the electrode into the chamber. The electric field established between the anode and the cathode will dissociate the reactive gas forming plasma. The surface of the wafer is etched by chemical interaction with the active ions and by momentum transfer of the ions striking the surface of the wafer. The electric field created by the electrodes will attract the ions to the cathode, causing the ions to strike the surface in a predominantly vertical direction so that the process produces well-defined vertically etched sidewalls. The etching reactor electrodes may often be fabricated by bonding two or more dissimilar members with mechanically compliant and/or thermally conductive adhesives, allowing for a multiplicity of function.

FIG. 1 shows a cross-sectional view of a portion of a showerhead electrode assembly 100 of a plasma processing system for etching substrates. As shown in FIG. 1, the showerhead electrode assembly 100 includes a stepped electrode 110, a backing plate 140, and a guard ring (or outer ring) 170. The showerhead electrode assembly 100 also includes a plasma confinement assembly (or wafer area pressure (WAP) assembly) 180, which surrounds the outer periphery of the upper electrode 110 and the backing plate 140.

The assembly 100 also includes a thermal control plate 102, and an upper (top) plate 104 having liquid flow channels therein and forming a temperature controlled wall of the chamber. The stepped electrode 110 is preferably a cylindrical plate and may be made of a conductive high purity material such as single crystal silicon, polycrystalline silicon, silicon carbide or other suitable material (such as aluminum or alloy thereof, anodized aluminum, yttria coated aluminum). The backing plate 140 is mechanically secured to the electrode 110 with mechanical fasteners described below. The guard ring 170 surrounds the backing plate 140 and provides access to cam locking members as described below.

The showerhead electrode assembly 100 as shown in FIG. 1 is typically used with an electrostatic chuck (not shown) incorporating a flat lower electrode on which a wafer is supported at a distance of about 1 to 2 cm below the upper electrode 110. An example of such a plasma processing system is a parallel plate type reactor, such as the Exelan® dielectric etch systems, made by Lam Research Corporation of Fremont, Calif. Such chucking arrangements provide temperature control of the wafer by supplying backside helium (He) pressure, which controls the rate of heat transfer between the wafer and the chuck. In embodiments, during plasma processing, the upper showerhead electrode is grounded and the bottom (lower) electrode is powered.

The upper electrode 110 is a consumable part which must be replaced periodically. To supply process gas to the gap between the wafer and the upper electrode, the upper electrode 110 is provided with a gas discharge passages 106, which are of a size and distribution suitable for supplying a process gas, which is energized by the electrode and forms plasma in a reaction zone beneath the upper electrode 110.

The showerhead electrode assembly 100 also includes a plasma confinement assembly (or wafer area plasma (WAP) assembly) 180, which surrounds the outer periphery of the upper electrode 110 and the backing plate 140. The plasma confinement assembly 180 is preferably comprised of a stack or plurality of spaced-apart quartz rings 190, which surrounds the outer periphery of upper electrode 110 and the backing plate 140. During processing, the plasma confinement assembly 180 causes a pressure differential in the reaction zone and increases the electrical resistance between the reaction chamber walls and the plasma thereby confining the plasma between the upper electrode 110 and the lower electrode (not shown).

During use, the confinement rings 190 confine the plasma to the chamber volume and controls the pressure of the plasma within the reaction chamber. The confinement of the plasma to the reaction chamber is a function of many factors including the spacing between the confinement rings 190, the pressure in the reaction chamber outside of the confinement rings and in the plasma, the type and flow rate of the gas, as well as the level and frequency of RF power. Confinement of the plasma is more easily accomplished if the spacing between the confinement rings 190 is very small. Typically, a spacing of 0.15 inches or less is required for confinement. However, the spacing of the confinement rings 190 also determines the pressure of the plasma, and it is desirable that the spacing can be adjusted to achieve the pressure required for optimal process performance while maintaining plasma. Process gas from a gas supply is supplied to electrode 110 through one or more passages in the upper plate 104 which permit process gas to be supplied to a single zone or multiple zones above the wafer.

The electrode 110 is preferably a planar disk or plate having a uniform thickness from center (not shown) to an area of increased thickness forming a step on the plasma exposed surface extending inwardly from an outer edge. The electrode 110 preferably has a diameter larger than a wafer to be processed, e.g., over 300 mm. The diameter of the upper electrode 110 can be from about 15 inches to about 17 inches for processing 300 mm wafers. The upper electrode 110 preferably includes multiple gas passages 106 for injecting a process gas into a space in a plasma reaction chamber below the upper electrode 110.

Single crystal silicon and polycrystalline silicon are preferred materials for plasma exposed surfaces of the electrode 110. High-purity, single crystal or polycrystalline silicon minimizes contamination of substrates during plasma processing as it introduces only a minimal amount of undesirable elements into the reaction chamber, and also wears smoothly during plasma processing, thereby minimizing particles. Alternative materials including composites of materials that can be used for plasma-exposed surfaces of the upper electrode 110 include aluminum (as used herein "aluminum" refers to pure Al and alloys thereof), yttria coated aluminum, SiC, SiN, and AlN, for example.

The backing plate 140 is preferably made of a material that is chemically compatible with process gases used for processing semiconductor substrates in the plasma processing chamber, has a coefficient of thermal expansion closely matching that of the electrode material, and/or is electrically and thermally conductive. Preferred materials that can be used to make the backing plate 140 include, but are not limited to, graphite, SiC, aluminum (Al), or other suitable materials.

The upper electrode 110 is attached mechanically to the backing plate 140 without any adhesive bonding between the electrode and backing plate, i.e., a thermally and electrically conductive elastomeric bonding material is not used to attach the electrode to the backing plate.

The backing plate 140 is preferably attached to the thermal control plate 102 with suitable mechanical fasteners, which can be threaded bolts, screws, or the like. For example, bolts (not shown) can be inserted in holes in the thermal control plate 102 and screwed into threaded openings in the backing plate 140. The thermal control plate 102 includes a flexure portion 184 and is preferably made of a machined metallic material, such as aluminum, an aluminum alloy or the like. The upper temperature controlled plate 104 is preferably made of aluminum or an aluminum alloy. The plasma confinement assembly (or wafer area plasma assembly (WAP)) 180 is positioned outwardly of the showerhead electrode assembly 100. A suitable plasma confinement assembly 180 including a plurality of vertically adjustable plasma confinement rings 190 is described in commonly owned U.S. Pat. No. 5,534,751, which is incorporated herein by reference in its entirety.

Figure 2A:
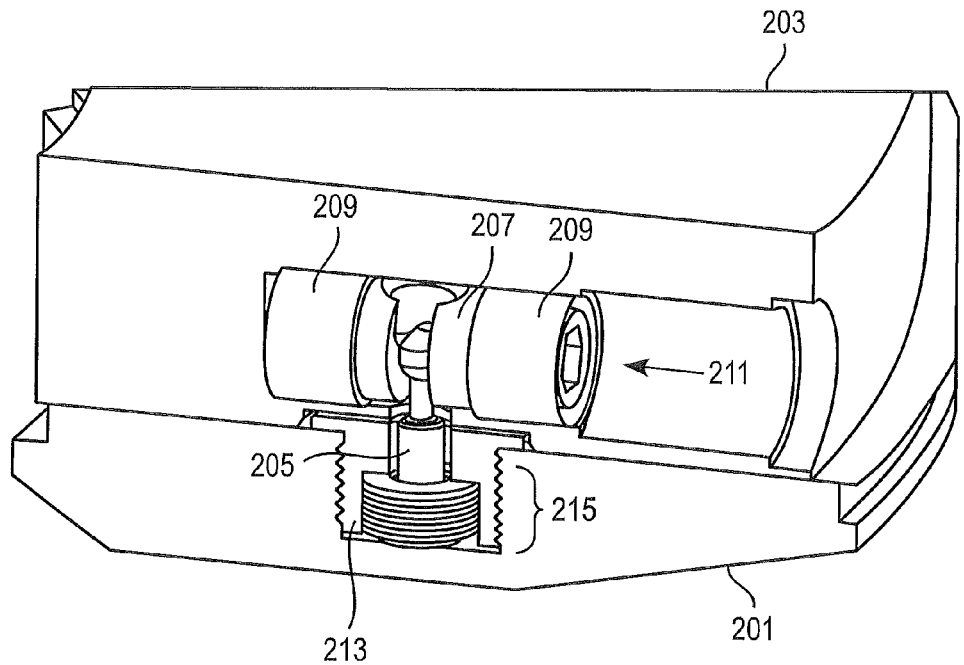
FIG. 2A is a three-dimensional representation of an exemplary cam lock for clamping a stepped electrode in the reactor shown in FIG. 1.

The upper electrode can be mechanically attached to the backing plate by a cam lock mechanism as described in commonly-owned U.S. application Ser. No. 61/036,862, filed Mar. 14, 2008, the disclosure of which is hereby incorporated by reference. With reference to FIG. 2A, a three-dimensional view of an exemplary cam lock electrode clamp includes portions of an electrode 201 and a backing plate 203. The electrode clamp is capable of quickly, cleanly, and accurately attaching a consumable electrode 201 to a backing plate in a variety of fab-related tools, such as the plasma etch chamber shown in FIG. 1.

The electrode clamp includes a stud (locking pin) 205 mounted into a socket 213. The stud may be surrounded by a disc spring stack 215, such, for example, stainless steel Belleville washers. The stud 205 and disc spring stack 215 may then be press-fit or otherwise fastened into the socket 213 through the use of adhesives or mechanical fasteners. The stud 205 and the disc spring stack 215 are arranged into the socket 213 such that a limited amount of lateral movement is possible between the electrode 201 and the backing plate 203. Limiting the amount of lateral movement allows for a tight fit between the electrode 201 and the backing plate 203, thus ensuring good thermal contact, while still providing some movement to account for differences in thermal expansion between the two parts. Additional details on the limited lateral movement feature are discussed in more detail, below.

In a specific exemplary embodiment, the socket 213 is fabricated from bearing-grade Torlon®. Alternatively, the socket 213 may be fabricated from other materials possessing certain mechanical characteristics such as good strength and impact resistance, creep resistance, dimensional stability, radiation resistance, and chemical resistance may be readily employed. Various materials such as polyamides, polyimides, acetals, and ultra-high molecular weight polyethylene materials may all be suitable. High temperature-specific plastics and other related materials are not required for forming the socket 213 as 230° C. is a typical maximum temperature encountered in applications such as etch chambers. Generally, a typical operating temperature is closer to 130° C.

Other portions of the electrode clamp are comprised of a camshaft 207 surrounded at each end by a pair of camshaft bearings 209. The camshaft 207 and camshaft bearing assembly is mounted into a backing plate bore 211 machined into the backing plate 203. In a typical application for an etch chamber designed for 300 mm semiconductor wafers, eight or more of the electrode clamps may be spaced around the periphery of the electrode 201/backing plate 203 combination.

The camshaft bearings 209 may be machined from a variety of materials including Torlon®, Vespel®, Celcon®, Delrin®, Teflon®, Arlon®, or other materials such as fluoropolymers, acetals, polyamides, polyimides, polytetrafluoroethylenes, and polyetheretherketones (PEEK) having a low coefficient of friction and low particle shedding. The stud 205 and camshaft 207 may be machined from stainless steel (e.g., 316, 316L, 17-7, etc.) or any other material providing good strength and corrosion resistance.

Figure 2B:
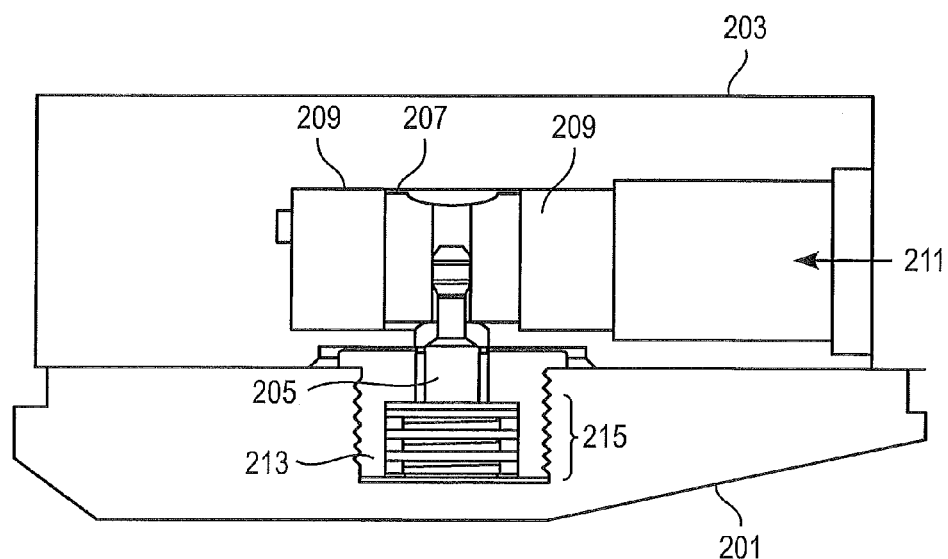
FIG. 2B is a cross-sectional view of the exemplary cam lock electrode clamp of FIG. 2A.

Referring now to FIG. 2B, a cross-sectional view of the electrode cam clamp further exemplifies how the cam clamp operates by pulling the electrode 201 in close proximity to the backing plate 203. The stud 205/disc spring stack 215/socket 213 assembly is mounted into the electrode 201. As shown, the assembly may be screwed, by means of external threads on the socket 213 into a threaded pocket in the electrode 201. However, the socket may be mounted by adhesives or other types of mechanical fasteners as well.

Figure 3:
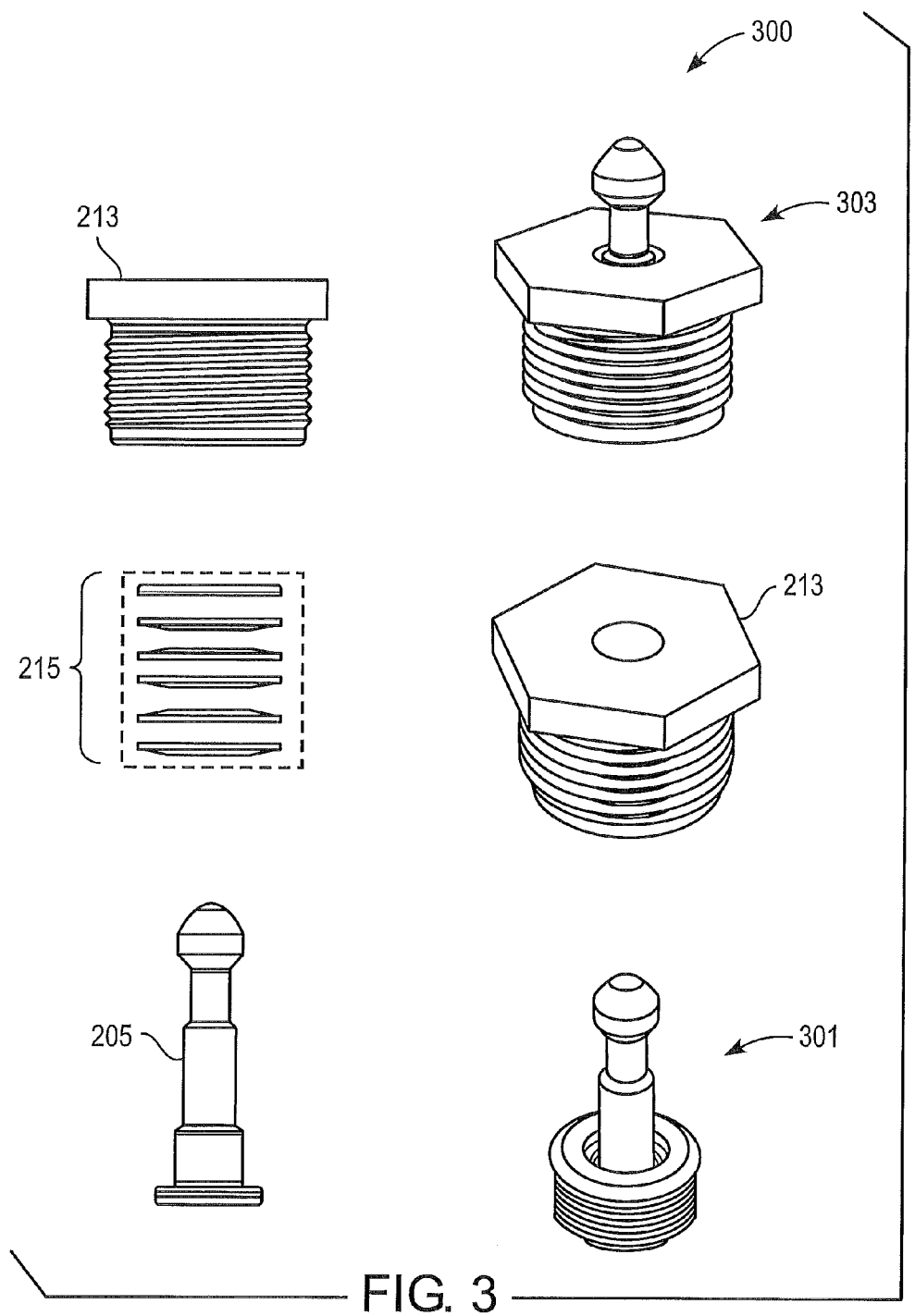
FIG. 3 shows side-elevation and assembly drawings of an exemplary locking pin used in the cam lock clamp of FIGS. 2A and 2B.

In FIG. 3, an elevation and assembly view 300 of the stud 205 having an enlarged head, disc spring stack 215, and socket 213 provides additional detail into an exemplary design of the cam lock electrode clamp. In a specific exemplary embodiment, a stud/disc spring assembly 301 is press fit into the socket 213. The socket 213 has an external thread and a hexagonal top member allowing for easy insertion into the electrode 201 (see FIGS. 2A and 2B) with light torque (e.g., in a specific exemplary embodiment, about 20 inch-pounds). As indicated above, the socket 213 may be machined from various types of plastics. Using plastics minimizes particle generation and allows for a gall-free installation of the socket 213 into a mating pocket on the electrode 201.

The stud/socket assembly 303 illustrates an inside diameter in an upper portion of the socket 213 being larger than an outside diameter of a mid-section portion of the stud 205. The difference in diameters between the two portions allows for the limited lateral movement in the assembled electrode clamp as discussed above. The stud/disc spring assembly 301 is maintained in rigid contact with the socket 213 at a base portion of the socket 213 while the difference in diameters allows for some lateral movement. (See also, FIG. 2B.)

Figure 4A:
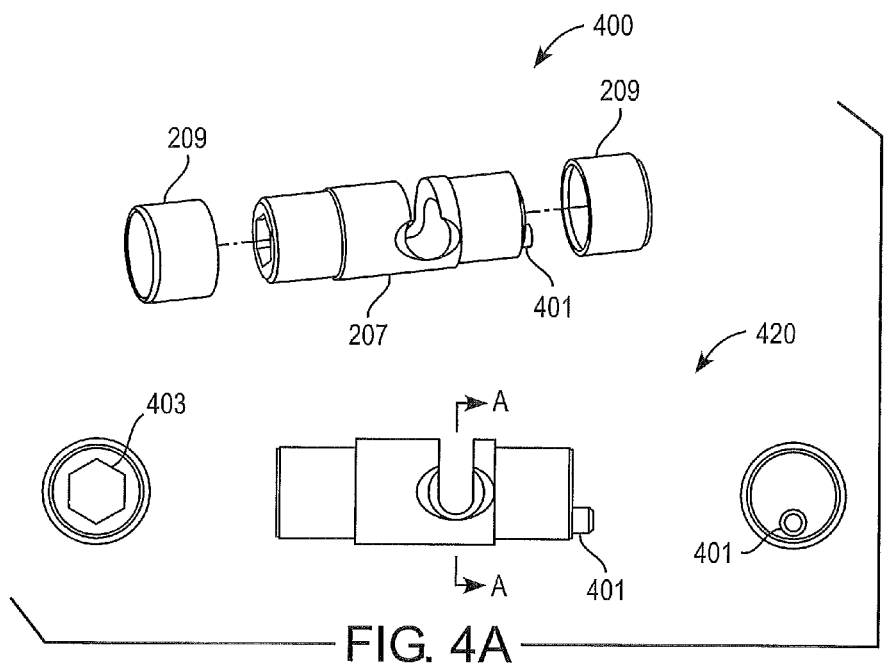
FIG. 4A shows side-elevation and assembly drawings of an exemplary cam shaft used in the cam lock clamp of FIGS. 2A and 2B.

With reference to FIG. 4A, an exploded view 400 of the camshaft 207 and camshaft bearings 209 also indicates a keying pin 401. The end of the camshaft 207 having the keying pin 401 is first inserted into the backing plate bore 211 (see FIG. 2B). A pair of small mating holes (not shown) at a far end of the backing plate bore 211 provide proper alignment of the camshaft 207 into the backing plate bore 211. A side-elevation view 420 of the camshaft 207 clearly indicates a possible placement of a hex opening 403 on one end of the camshaft 207 and the keying pin 401 on the opposite end.

For example, with continued reference to FIGS. 4A and 2B, the electrode cam clamp is assembled by inserting the camshaft 207 into the backing plate bore 211. The keying pin 401 limits rotational travel of the camshaft 207 in the backing plate bore 211 by interfacing with one of the pair of small mating holes. The camshaft may first be turned in one direction though use of the hex opening 403, for example, counterclockwise, to allow entry of the stud 205 into the camshaft 207, and then turned clockwise to fully engage and lock the stud 205. The clamp force required to hold the electrode 201 to the backing plate 203 is supplied by compressing the disc spring stack 215 beyond their free stack height. The camshaft 207 has an eccentric internal cutout which engages the enlarged head of the shaft 205. As the disc spring stack 215 compresses, the clamp force is transmitted from individual springs in the disc spring stack 215 to the socket 213 and through the electrode 201 to the backing plate 203.

In an exemplary mode of operation, once the camshaft bearings are attached to the camshaft 207 and inserted into the backing plate bore 211, the camshaft 207 is rotated counterclockwise to its full rotational travel. The stud/socket assembly 303 (FIG. 3) is then lightly torqued into the electrode 201. The head of the stud 205 is then inserted into the vertically extending through hole below the horizontally extending backing plate bore 211. The electrode 201 is held against the backing plate 203 and the camshaft 207 is rotated clockwise until either the keying pin drops into the second of the two small mating holes (not shown) or an audible click is heard (discussed in detail, below). The exemplary mode of operation may be reversed to dismount the electrode 201 from the backing plate 203. However, features such as the audible click are optional in the cam lock arrangement.

Figure 4B:
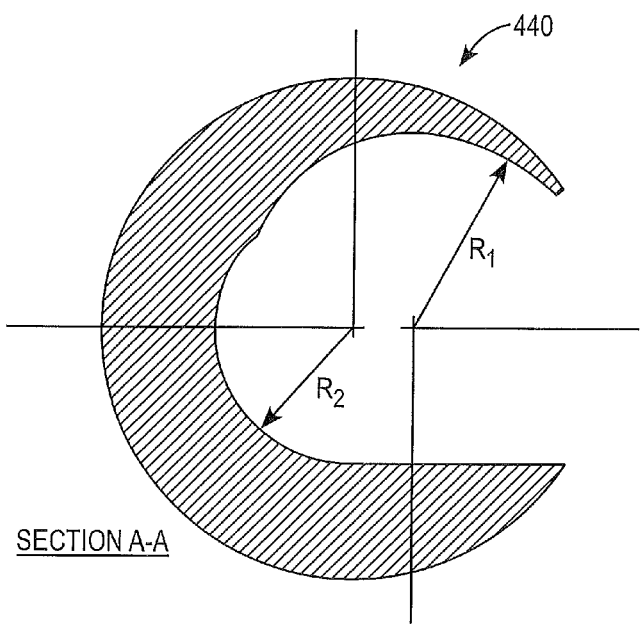
FIG. 4B shows a cross-sectional view of an exemplary cutter-path edge of a portion of the cam shaft of FIG. 4A.

With reference to FIG. 4B, a sectional view A-A of the side-elevation view 420 of the camshaft 207 of FIG. 4A indicates a cutter path edge 440 by which the head of the stud 205 is fully secured. In a specific exemplary embodiment, the two radii $R_1$ and $R_2$ are chosen such that the head of the stud 205 makes the optional audible clicking noise described above to indicate when the stud 205 is fully secured.

Figure 5:
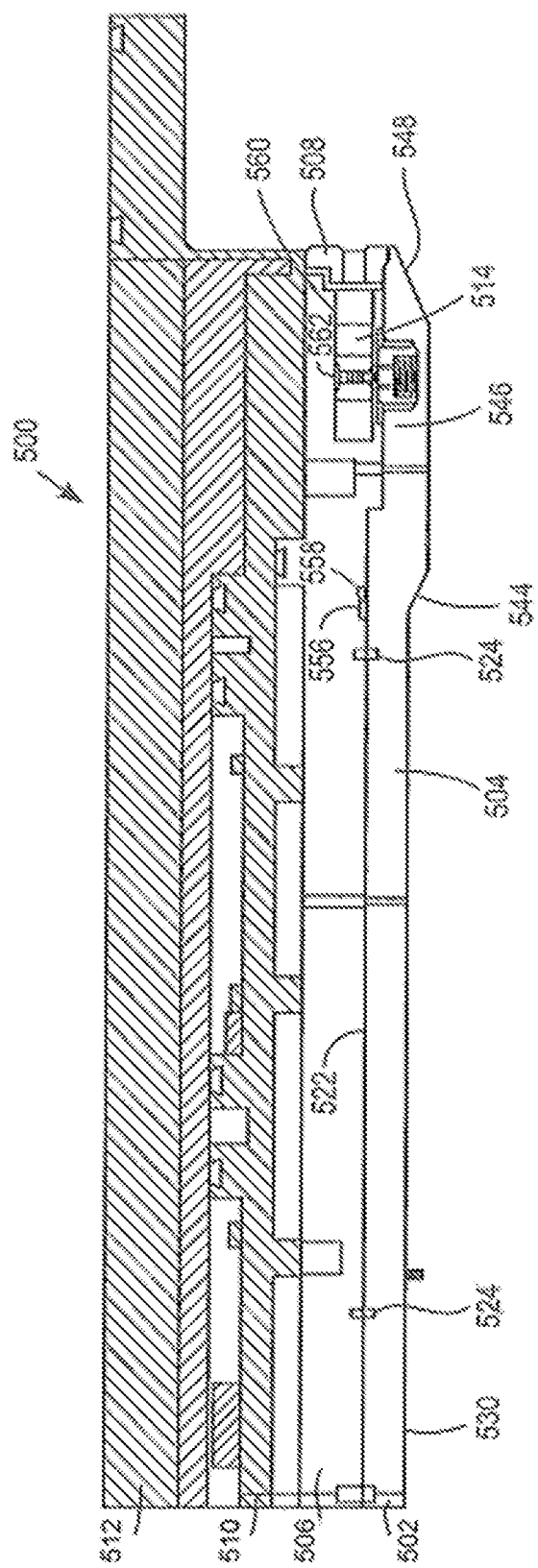
FIG. 5 shows a showerhead electrode assembly with a stepped electrode, backing plate, thermal control plate, guard ring and top plate.

FIG. 5 illustrates an upper electrode assembly 500 for a capacitively coupled plasma chamber which includes the following features: (a) a cam-locked non-bonded electrode 502; (b) a backing plate 506; and (c) a guard ring 508 which allows access to cam locks holding the electrode to the backing plate 506.

The electrode assembly 500 includes a thermal control plate 510 bolted from outside the chamber to a temperature controlled top wall 512 of the chamber. The electrode 502 is releasably attached to the backing plate from inside the chamber by cam-lock mechanisms 514 described earlier with reference to FIGS. 2-4.

In a preferred embodiment, the electrode 502 of the electrode assembly 500 can be disassembled by (a) rotating the guard ring 508 to a first position aligning four holes in the guard ring with four cam locks 514 located at spaced positions in the outer portion of the backing plate; (b) inserting a tool such as an alien wrench through each hole in the guard ring and rotating each cam lock to release a vertically extending locking pin of each respective cam lock; (c) rotating the guard ring 90° to a second position aligning the four holes in the guard ring with another four cam locks; and (d) inserting a tool such as an allen wrench through each hole in the guard ring and rotating each respective cam lock to release a locking pin of each respective cam lock; whereby the electrode 502 can be lowered and removed from the plasma chamber.

FIG. 5 also shows a cross-sectional view of one of the cam lock arrangements wherein a rotatable cam lock 514 is located in a horizontally extending bore 560 in an outer portion of the backing plate 506. The cylindrical cam lock 514 is rotatable by a tool such as an allen wrench to (a) a lock position at which an enlarged end of a locking pin 562 is engaged by a cam surface of the cam lock 514 which lifts the enlarged head of the locking pin or (b) a release position at which the locking pin 562 is not engaged by the cam lock 514. The backing plate includes vertically extending bores in its lower face through which the locking pins are inserted to engage the cam locks.

Figure 6A:
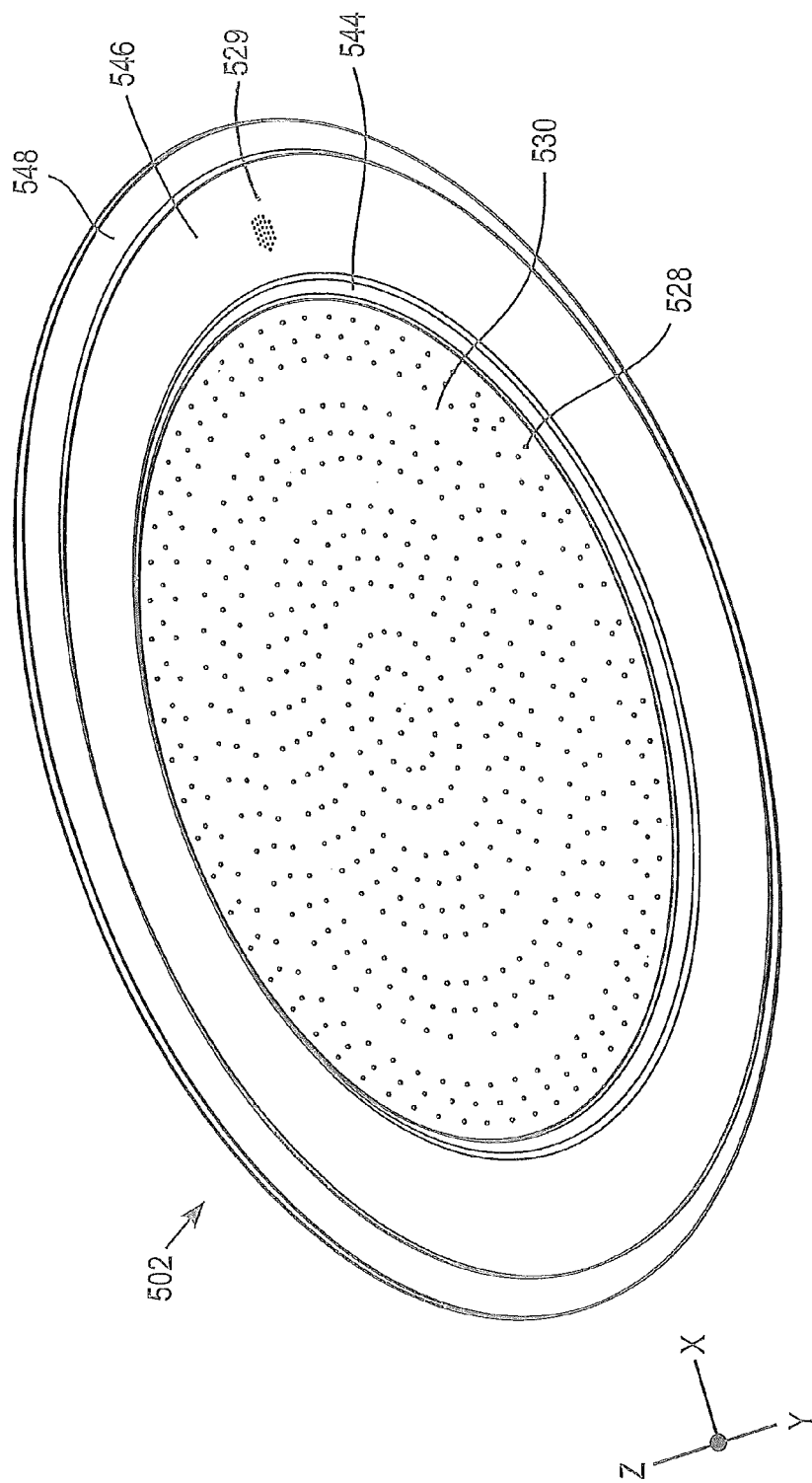
FIGS. 6A and 6B are perspective views of the stepped electrode.
Figure 6B:
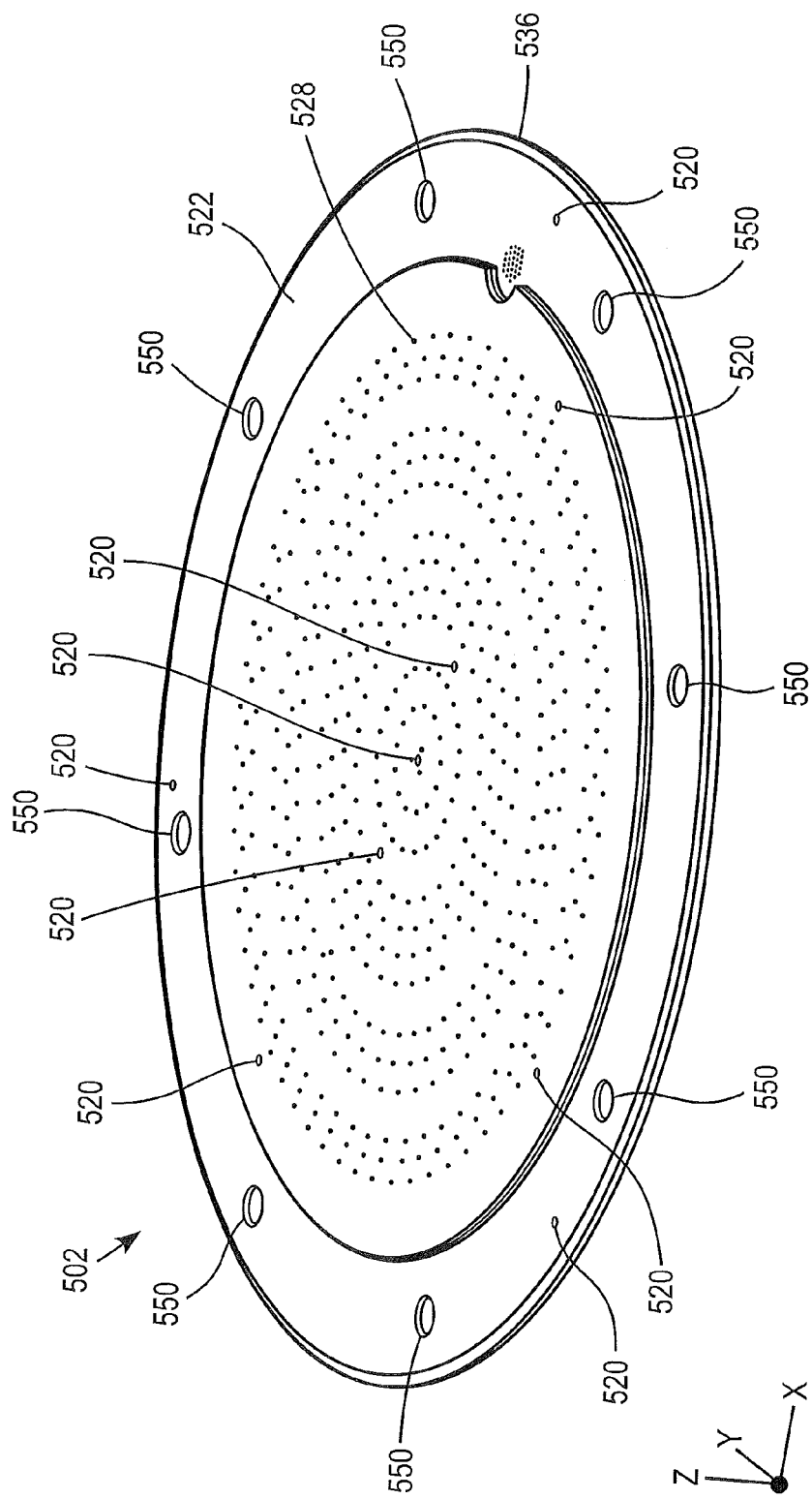

FIGS. 6A-B show details of the electrode 502. The electrode 502 is preferably a plate of high purity (less than 10 ppm impurities) low resistivity (0.005 to 0.02 ohm-cm) single crystal silicon with alignment pin holes 520 in an upper face (mounting surface) 522 which receive alignment pins 524. Gas holes 528 extend from the upper face to the lower face (plasma exposed surface) 530 and can be arranged in any suitable pattern. In the embodiment shown, the gas holes are arranged in 13 circumferentially extending rows with three gas holes in the first row located about 0.5 inch from the center of the electrode, 13 gas holes in the second row located about 1.4 inches from the center, 23 gas holes in the third row located about 2.5 inches from the center, 25 gas holes in the fourth row located about 3.9 inches from the center, 29 gas holes in the fifth row located about 4.6 inches from the center, 34 gas holes in the sixth row located about 5.4 inches from the center, 39 gas holes in the seventh row located about 6 inches from the center, 50 gas holes in the eighth row located about 7.5 inches from the center, 52 gas holes in the ninth row located about 8.2 inches from the center, 53 gas holes in the tenth row located about 9 inches from the center, 57 gas holes in the eleventh row located about 10.3 inches from the center, 59 gas holes in the twelfth row located about 10.9 inches from the center and 63 holes in the thirteenth row located about 11.4 inches from the center.

The upper face of the electrode includes 9 alignment pin holes with 3 pin holes near the center, 3 pin holes inward of the annular recess and 3 pin holes in the annular recess near the outer edge of the electrode. The 3 central pin holes are radially aligned and include a pin hole at the center of the inner electrode and 2 pin holes between the third and fourth rows of gas holes. The intermediate pin holes near the annular recess include one pin hole radially aligned with the central pin hole and two other pin holes spaced 120° apart. The outer 3 pin holes are spaced 120° apart at locations between adjacent pockets.

FIG. 6A is a front perspective view showing the plasma exposed surface 530 of the electrode 502 with the 13 rows of gas holes. FIG. 6B shows a perspective view of the upper face with the 13 rows of gas holes. The electrode 502 includes a confined pattern of holes 529 in the stepped outer surface 546 to cooperate with a manometer unit to provide vacuum pressure measurements in the chamber.

The electrode 502 includes an outer step (ledge) 536 which supports the guard ring 508, the upper face (mounting surface) 522 which engages a lower surface of the backing plate 506, the lower face (plasma exposed stepped surface) 530 which includes inner tapered surface 544, a horizontal surface 546, and an outer tapered surface 548 and 8 pockets 550 in upper face 540 in which the locking pins are mounted.

Figure 7:
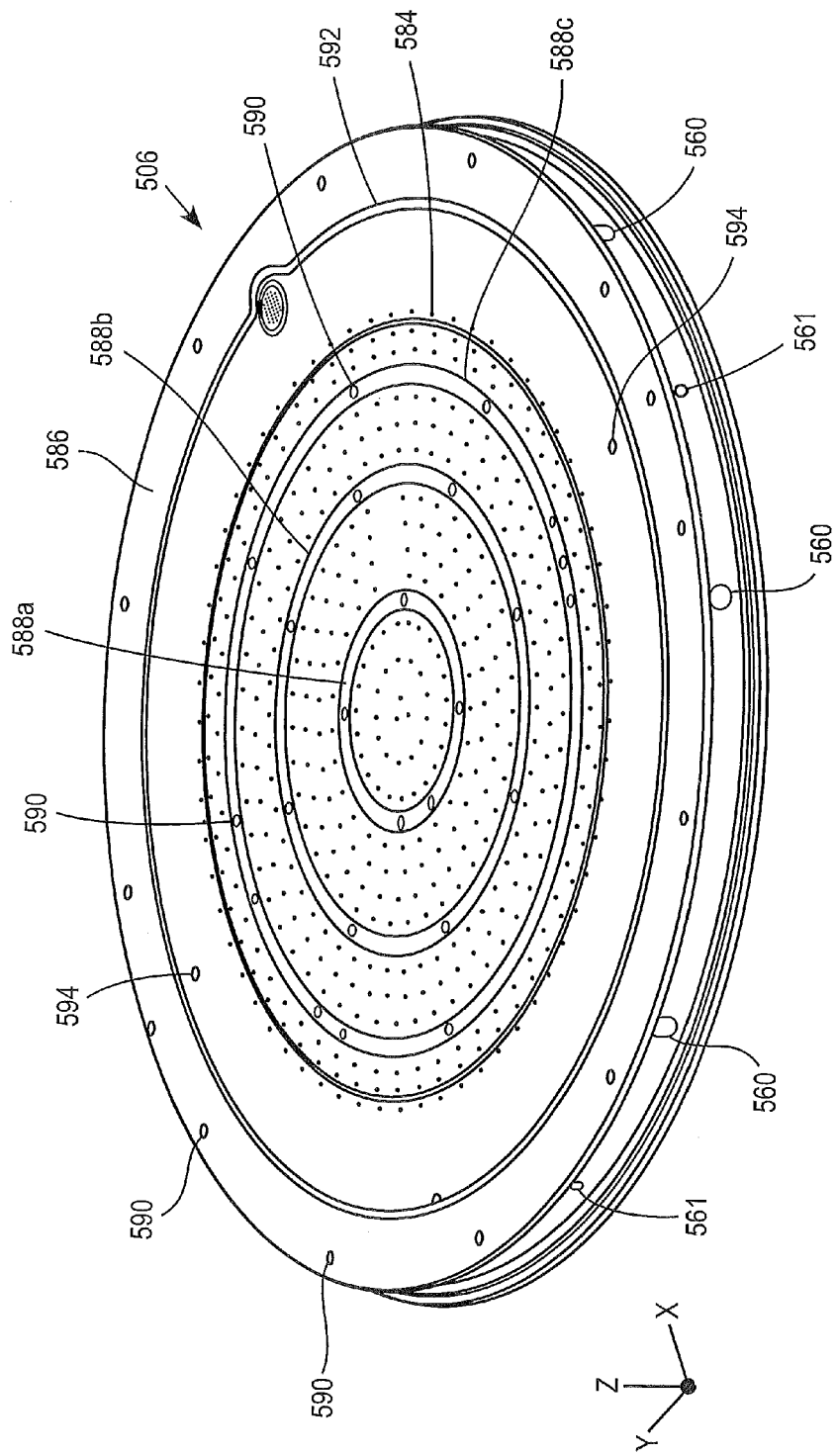
FIG. 7 is a perspective view of a backing plate.

FIG. 7 is a perspective view of backing plate 506. The backing plate is free of thermal control coolant passages and heating elements. The backing plate includes 13 rows of gas passages 584 which align with the passages 528 in the showerhead electrode 502. The upper face 586 of the backing plate includes three annular regions 588$a$, 588$b$, 588$c$ which contact annular projections of the thermal control plate 510. The thermal control plate can be attached to the top wall of the plasma chamber by fasteners extending through the top wall into the thermal control plate as disclosed in commonly-assigned U.S. Patent Publication Nos. 2005/0133160, 2007/0068629, 2007/0187038, 2008/0087641 and 2008/0090417, the disclosures of which are hereby incorporated in their entirety. Threaded openings 590 are located in an outer periphery of the upper face 586 and the annular regions 588$a$, 588$b$, 588$c$ to receive fasteners extending through openings in the top plate 512 and thermal control plate 510 to hold the backing plate 506 in contract with the thermal control plate 510. See, for example, commonly-assigned U.S. Patent Publication No. 2008/0087641 for a description of fasteners which can accommodate thermal cycling. A groove 592 in the upper face 586 receives an O-ring which provides a gas seal between the backing plate 506 and the thermal control plate 510. The gas seal is located outwardly of the gas passages in the backing plate. Alignment pin bores 594 in the upper face 586 receive alignment pins which fit into alignment pin bores in the thermal control plate. Horizontally extending threaded openings 561 at positions between bores 560 receive dielectric fasteners used to prevent the guard ring from rotating and plug the access bores in the guard ring after assembly of the showerhead electrode.

Figure 8:
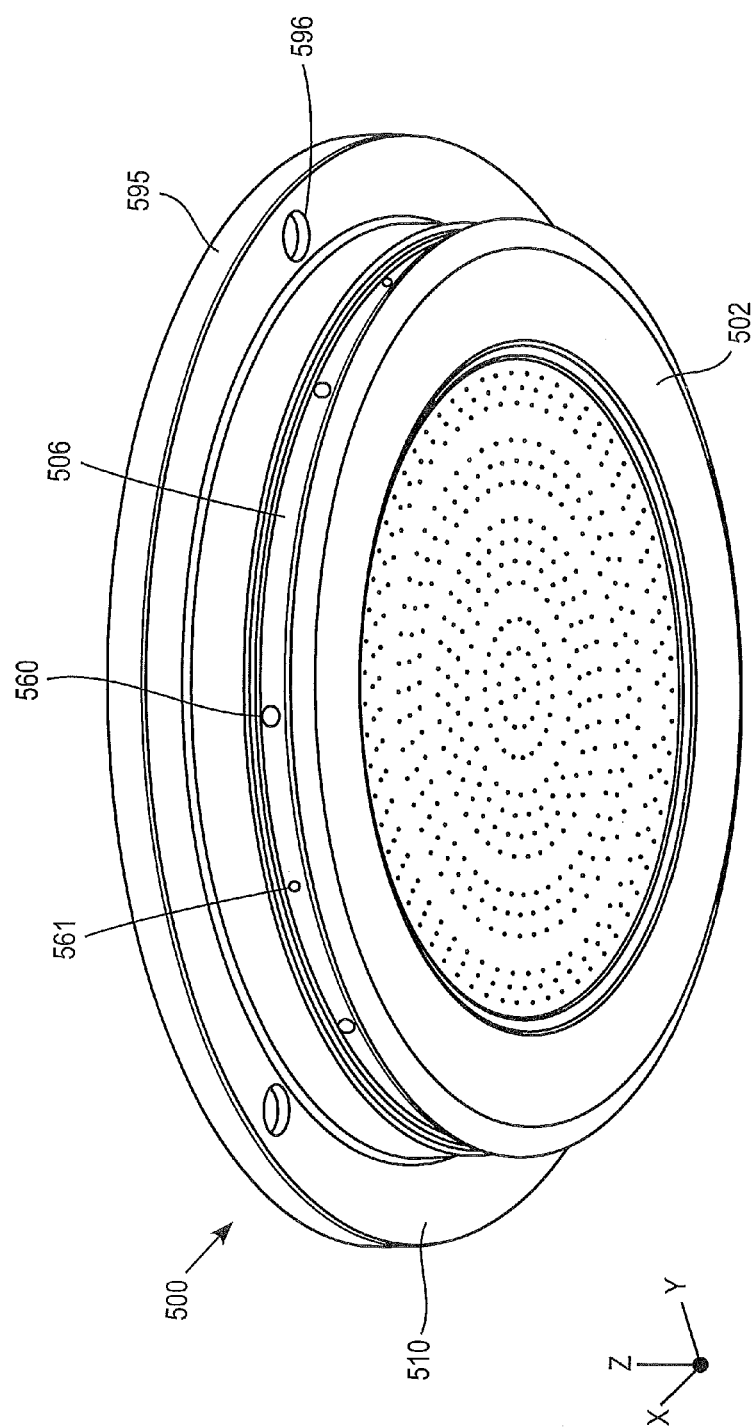
FIG. 8 is a perspective view of the showerhead electrode assembly without the guard ring.

FIG. 8 is a perspective view of the showerhead electrode assembly 500 with the guard ring removed. As explained earlier, the guard ring can be rotated to one or more assembly positions at which the cam locks can be engaged and rotated to a lock position at which dielectric fasteners can be inserted into openings 561 to maintain the guard ring out of contact with the outer periphery of the backing plate and thus allow for thermal expansion of the backing plate. The thermal control plate includes a flange 595 with openings 596 through which actuators support the plasma confinement rings. Details of the mounting arrangement of plasma confinement ring assemblies can be found in commonly-assigned U.S. Patent Publication No. 2006/0207502 and 2006/0283552, the disclosures of which are hereby incorporated in their entirety.

The mounting surface 522 of the electrode abuts an opposed surface of the backing plate 506 as a result of the clamping force exerted by the 8 locking pins held by the 8 cam locks in the backing plate. The guard ring 508 covers the mounting holes in the backing plate 506 and the access openings in the guard ring are filled with removable inserts made of plasma resistant polymer material such as Torlon®, Vespel®, Celcon®, Delrin®, Teflon®, Arlon®, or other materials such as fluoropolymers, acetals, polyamides, polyimides, polytetrafluoroethylenes, and polyetheretherketones (PEEK) having a low coefficient of friction and low particle shedding.

With reference to FIG. 5, electrical contact between the backing plate 506 and electrode 502 is provided by one or more Q-pads 556 located at the outer periphery of the electrode and at one or more locations between the central alignment pin and the outer Q-pad. For example, Q-pads having diameters of about 4 and 12 inches can be used. Commonly-owned U.S. application Ser. No. 11/896,375, filed Aug. 31, 2007, includes details of Q-pads, the disclosure of which is hereby incorporated by reference. To provide different process gas mixtures and/or flow rates, one or more optional gas partition seals can be provided between the center alignment pin and the outer Q-pad. For example, a single O-ring can be provided between the electrode 502 and the backing plate 506 at a location between the inner and outer Q-pads to separate an inner gas distribution zone from an outer gas distribution zone. An O-ring 558 located between the electrode 502 and the backing plate 506 along the inner periphery of the outer Q-pad can provide a gas and particle seal between the electrode and backing plate.

While the invention has been described in detail with reference to specific embodiments thereof, it will be apparent to those skilled in the art that various changes and modifications can be made, and equivalents employed, without departing from the scope of the appended claims.

What is claimed is:

1. A method of treating a semiconductor substrate in a plasma chamber, said method comprising the steps of:
    supporting the semiconductor substrate on a bottom electrode in the chamber;
    supplying process gas to the chamber;
    forming a plasma adjacent an exposed surface of an upper electrode, the upper electrode comprising a showerhead electrode comprising:
        a central portion and a peripheral portion defined by upper and lower faces of the showerhead electrode, the upper face including a planar surface extending across the central portion, the lower face defined by a planar inner surface extending across the central portion and a stepped outer surface extending across the peripheral portion, the stepped outer surface including an annular planar surface defining an area of increased thickness of the showerhead electrode;
        a plurality of gas outlets in the central portion of the electrode through which process gas can be delivered to a gap between the showerhead electrode and a lower electrode on which the semiconductor substrate is supported; and
        a plurality of circumferentially spaced apart pockets in the upper face, the pockets configured to receive cam locks therein adapted to clamp the showerhead electrode to a backing plate;
    heating the showerhead electrode and backing plate to an elevated temperature which causes differential thermal expansion of the showerhead electrode and the backing plate, and accommodating the thermal expansion by movement of locking pins; and
    processing the semiconductor substrate with the plasma.

2. The method as claimed in claim 1, wherein temperature of the showerhead electrode is controlled by a temperature controlled top wall of the chamber, a thermal control plate and the backing plate, the thermal control plate including annular projections forming plenums between the thermal control plate and the backing plate,
    wherein the plenums are in fluid communication with gas passages in the backing plate aligned with the gas passages in the showerhead electrode, and the backing plate provides a thermal path between the showerhead electrode and the thermal control plate.

3. The method as claimed in claim 1, wherein the semiconductor substrate comprises a semiconductor wafer and the processing step comprises etching the semiconductor wafer with the plasma.

4. The method as claimed in claim 1, wherein the upper electrode is grounded and the bottom electrode is powered during the processing step.

5. The method of claim 1, wherein a confined pattern of gas holes in the stepped outer surface cooperates with a manometer unit to provide vacuum pressure measurements in the chamber.

6. The method of claim 1, wherein the showerhead electrode is a plate of polycrystalline silicon, single crystal silicon, silicon carbide, aluminum, anodized aluminum or yttria coated aluminum.

7. The method of claim 1, wherein the showerhead electrode is attached to the backing plate and a thermal control plate is attached to the backing plate, the thermal control plate having annular projections on a lower surface thereof defining gas plenums in communication with the gas passages in the backing plate.

8. The method of claim 7, wherein the backing plate is free of thermal control coolant passages and heating elements.

9. The method of claim 7, wherein a gas seal is between the backing plate and the showerhead electrode, the gas seal being located outwardly of the gas passages.

* * * * *